HERMETICALLY SEALED SEMICONDUCTOR DEVICES

Filed Sept. 21, 1962

WITNESSES

Edwin E. Bassler

Raymond J. Majcsko

INVENTORS
Joseph Marino, Thomas P. Nowalk
and William R. Schaefer
BY
Frederick Shapoe
ATTORNEY

United States Patent Office 3,155,885
Patented Nov. 3, 1964

3,155,885
HERMETICALLY SEALED SEMICONDUCTOR DEVICES

Joseph Marino and Thomas P. Nowalk, Irwin, and William R. Schaefer, Greensburg, Pa., assignors to Westinghouse Electric Corporation, Pittsburgh, Pa., a corporation of Pennsylvania Filed Sept. 21, 1962, Ser. No. 225,351
4 Claims. (Cl. 317—234)

The present invention is concerned with improvements in or relating to sealed electrical devices.

In known methods of fabricating sealed electrical devices comprising an electrode support member mounting a semiconductor element, the element was joined to the support by hard or soft solders. Semiconductor devices fabricated by employing soft solders are characterized by relatively short operating lifetimes owing to thermal fatigue of the soft soldered joints. Devices fabricated employing hard solders usually require relatively high processing temperatures which may be ultimately deleterious to the semiconductor element proper.

Therefore, an object of the present invention is to provide a semiconductor device comprising a support mounting a semiconductor element and a header enclosing the element, in which, electrical contact between the element and the support is maintained solely by the means of adjustable pressure means.

Another object of the invention is to provide a reliable hermetically sealed semiconductor device comprising an electrode support of a good electrically and thermally conductive metal having an upwardly extending, threaded base mounting portion having an upper surface, a semiconductor element disposed on the upper surface of the base mounting portion, at least one electrical conductor disposed on the element, at least one spring member disposed on the element, a cylindrical metal member having an integrally connected apertured cap at the upper end thereof and a threaded segment on the inner periphery of the lower end disposed on the base mounting portion enclosing the element and cooperating therewith to provide a desired pressure on the spring member thereby exerting pressure on the semiconductor element to provide good electrical contact between the electrical lead and the element and between the element and the upper surface of the base mounting portion without the use of a solder and a header completely enclosing the element and joined to the support.

A further object of the invention is to provide a hermetically sealed semiconductor device wherein a semiconductor element is resiliently urged by spring means into good electrical and thermal contact with an electrode support and adjustable means affixed to the support member are provided within the hermetic casing to vary the spring pressure.

Other objects of the invention will, in part, be obvious and will, in part, appear hereinafter.

In order to more fully understand the nature and objects of the invention, reference should be had to the following detailed description and drawings, in which.

Figure 1:
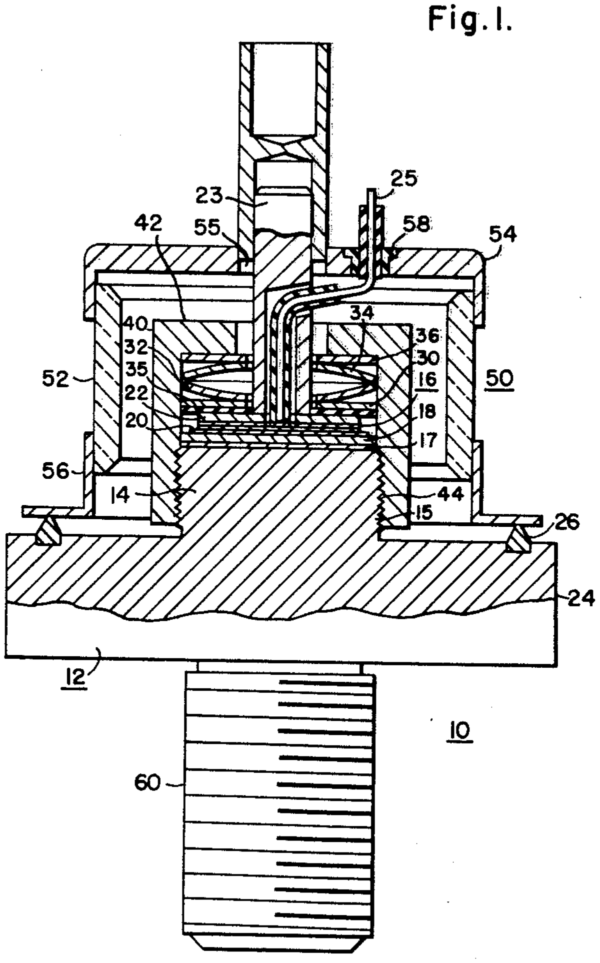
FIGURE 1 is a vertical section of a sealed electrical device.

In accordance with the present invention and in attainment of the foregoing objects, there is provided a sealed electrical device comprising a good electrically and thermally conductive support having an upper surface, a semiconductor element disposed on the upper surface of the support, at least one electrical lead disposed on the semiconductor element, adjustable compressive spring means acting on the element to provide a predetermined good electrical contact between the element and the support, and a header joined to the support to provide a hermetic enclosure for the element.

More particularly, there is provided a hermetically sealed semiconductor device having a thermally conductive support member of a metal selected from the group consisting of copper, copper base alloys, silver, silver base alloys, aluminum and aluminum base alloys and ferrous base alloys. The support member comprises a peripheral flange having an upper surface and a centrally located, upwardly extending, threaded base mounting portion having an upper surface on which a contact assembly comprising a semiconductor element and at least one cathode and anode contact may be disposed in a stacked arrangement. The surfaces of the element and contacts are closely conforming so as to enable good electrical contact therewith. The semiconductor element is soldered preferably with hard solder to an electrode contact member of a good electrical and thermal conductor, such as, molybdenum, tungsten, tantalum or base alloys thereof and is disposed on the upper surface of the base mounting portion. One or more electrical conductors may be joined to a counterelectrode contact member of the semiconductor element prior to the assembly of the device in order to conduct current to the device from exterior sources. A plurality of spring members, such as, spring washers are disposed on the upper surface of the counterelectrode contact member of the semiconductor element. A cylindrical metal member comprising, for instance, a ferrous base metal, having an integrally connected apertured cap at the upper end thereof and a threaded portion on the inner periphery at the lower end is disposed on the base mounting portion so as to enclose the element. The cylindrical member is threadedly engaged so that after external pressure is applied to the spring members the cylindrical member may be positioned so that the threaded portion of the cylindrical member engages with the threads on the base mounting portion to provide a selected constant pressure on the spring members thereby exerting pressure on the contact assembly to provide good electrical contact between the cathode contact and the semiconductor element and between the anode contact and the upper surface of the base mounting portion. Thereafter, a header member having a laterally extending flange and an insulating segment is welded to the outer periphery of the upper surface of the flange of the support to provide a hermetic enclosure for the semiconductor element.

Referring to FIG. 1, a sealed electrical device 10 according to the invention comprises an electrical contact heat dissipating support member 12 of a metal selected from the group consisting of copper, copper base alloys, silver, silver base alloys, aluminum and aluminum base alloys and ferrous base alloys. Copper and brass have been found particularly satisfactory for this purpose. The support member 12 comprises a centrally disposed upwardly extending flat surfaced mounting portion 14 comprising threads 15 on the outer periphery on which a contact assembly 16 comprising an anode contact 18, a semiconductor element 20, and a cathode contact 22, may be disposed so that electrical current may be conducted thereto and heat may be dissipated to the support member. The mounting portion 14 is circumscribed by a peripheral flange 24, the upper surface of the flange having a metal ring 26 joined to its upper periphery.

Figure 2:
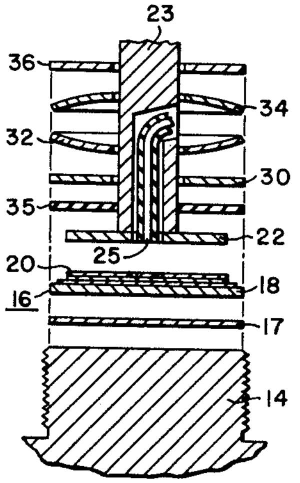
FIG. 2 is an enlarged fragmentary exploded sectional view showing the details of the center portion of FIG. 1 adjacent to the cylindrical metal member.

As shown in more detail in the exploded view in FIG. 2, the anode contact 18 comprising a metal, such as, molybdenum or tungsten or base alloys thereof provides a firm supporting structure for a semiconductor element 20 with substantially similar thermal expansion characteristics along with good electrical and thermal conductivity. The anode contact 18 may be separated from the mounting portion 14 by a non-reactive, malleable, electrically and thermally conductive metal layer 17, such as, gold or silver to compensate for surface irregularities. The semiconductor element 20 may be and preferably is joined to the anode contact 18 in a prior joining operation. The cathode contact 22 may comprise a metal, such as, molybdenum and has joined thereto electrical conductors 23 and 25 electrically insulated from each other. The dual conductors 23 and 25 employed are required in devices such as controlled rectifiers. However, it should be understood that in simple diode rectifiers, only one conductor such as 23 is necessary. It is important that the surfaces between contact 18 and layer 17 as well as the surfaces between cathode contact 22 and the semiconductor element 20 be closely similar—i.e., be flat and planar so that no uneven pressures develop when compressed. The malleable layer 17 will compensate for any minor surface irregularities.

After the contact assembly 16 comprising contacts 18 and 22 and the semiconductor element 20 are disposed on the mounting portion 14, a flat metal washer 30 resting on an insulating washer 35 of ceramic or mica, and spring washers 32 and 34, followed by another flat washer 36 are stacked on the contact assembly 16 and circumscribe conductors 23 and 25. A ferrous base metal cylindrical member 40 having an integrally connected apertured cap 42 on the upper end and a threaded portion 44 on the inner periphery at the lower end is disposed. A means of exerting pressure is positioned within the aperture—the cylindrical member 40 and around conductors 23 and 25 and a predetermined pressure is applied to upper washer 36 on the base mounting portion 14. The threaded portion 44 of the cylindrical member 40 is then engaged with threads 15 of the base mounting portion 14 to maintain the predetermined substantially constant pressure by coaction with the spring washers 32, 34 on the contact assembly 16 to provide good electrical contact between the semiconductor element 20 and the cathode contact 22 and between the anode contact 18 and the mounting portion 14 of the support 12. The external pressure means may then be released. A hydraulic press or other means may be employed to provide a selected pressure on the element and contacts. Pressures of the order of from 1000 lbs. to 2000 lbs. may be applied. A pressure of 1500 lbs. has been found to be particularly satisfactory. A header member 50 comprising a ceramic sleeve 52 with a cap member 54 joined to the upper end and a ferrous base metal laterally extending flange 56 joined to the outer lower end is welded to the ring member 26. The cap 54 comprises an insulating segment 58 with the electrical conductor 25 passing therethrough. The electrical conductor 23 passes through a centrally located aperture 55 in the cap 54.

On the opposite surface of the support member 12 may be attached an electrical contact and thermal dissipating stud 60 to connect the support to an electrical conductor and heat sink.

It should be understood that the ferrous base metal flange 56 may be welded directly to the flange 24 of the support 12 or may be welded to the support in the manner set forth in Patent 3,005,867.

Furthermore, it should be understood that the header 50 indicated in FIG. 1 is of typical construction but in no way limits the invention. Other headers such as those disclosed in Patent 3,005,867 and patent application Serial No. 185,765 may also be employed.

The adjustable threaded cylindrical member is precisely and easily set such that it enables the semiconductor device to be assembled with a predetermined pressure with respect to the support. Since the contacts 22 and 18 are not soldered to their mating underlying surfaces, there are no forces developed by reason of unequal temperatures during operation which impose bowing or warping stresses on the semiconductor element. Consequently, the semiconductor wafer will not crack or break.

Since certain changes in the product embodying the invention may be made without departing from its scope, it is intended that the accompanying description and drawings be interpreted as illustrative and not limiting.

We claim as our invention:

1. A sealed electrical device comprising a good thermally conductive support having a peripheral flange having an upper surface and an upwardly extending, threaded base mounting portion having an upper surface; a semiconductor element disposed on the upper surface of the base mounting portion; at least one electrical conductor disposed to the semiconductor element; at least one spring member disposed on the element; a cylindrical metal member having an integrally connected apertured cap at the upper end thereof and a threaded segment on the inner periphery of the lower end disposed on the base mounting portion and enclosing the element, the threaded segment cooperating with the threads on the base mounting portion to provide a constant pressure on the spring member thereby exerting pressure on the semiconductor element to provide good electrical contact between the electrical lead and the element and between the element and the upper surface of the base mounting portion, and a header member containing an insulating segment with the electrical conductor passing therethrough joined to the outer periphery of the upper surface of the flange of the support to provide a hermetic enclosure for the semiconductor element.

2. A sealed electrical device comprising a good thermally conductive support having a peripheral flange having an upper surface and an upwardly extending, threaded base mounting portion having an upper surface; a contact assembly comprising a semiconductor element and at least one cathode and anode contact disposed on the upper surface of the base mounting portion; at least one electrical conductor joined to the cathode contact; a plurality of spring washers disposed on the cathode contact; a ferrous base metal cylindrical member having an integrally connected apertured cap at the upper end thereof and a threaded segment on the inner periphery of the lower end disposed on the base mounting portion and enclosing the element, the threaded segment cooperating with the threads on the base mounting portion to provide a constant pressure on the spring washers thereby exerting pressure on the contact assembly to provide good electrical contact between the cathode contact and the semiconductor element and between the anode contact the upper surface of the base mounting portion, and, a header member containing an insulating segment with the electrical conductor passing therethrough and having a laterally extending ferrous base metal flange welded to the outer periphery of the upper surface of the flange of the support to provide a hermetic enclosure for the contact assembly.

3. A sealed electrical device comprising a good thermally conductive support having a peripheral flange having an upper surface and an upwardly extending, threaded base mounting portion having an upper surface; a ferrous base metal ring member hermetically mounted on the upper surface of the peripheral flange of the support, a contact assembly comprising a semiconductor element and at least one cathode and anode contact disposed on the upper surface of the base mounting portion; at least one electrical conductor joined to the cathode contact; a plurality of spring washers disposed on the cathode contact around the electrical conductor; a ferrous base metal cylindrical member having an integrally connected apertured cap at the upper end thereof and a threaded segment on the inner periphery of the lower end disposed on the base mounting portion and enclosing the element, the threaded segment cooperating with the threads on the base mounting portion to provide a constant pressure on the spring washers thereby exerting pressure on the contact assembly to provide good electrical contact between the cathode contact and the element and between the anode contact and the upper surface of the base mounting portion; a header member containing an insulating segment with the electrical conductor passing therethrough and having a laterally extending ferrous base metal flange adapted to fit against the ring member, the flange being welded to the ring member to provide a hermetic enclosure for the contact assembly; and, a stud extending from the opposite surface of the support for mounting the support on a heat sink.

4. A sealed electrical device comprising a good thermally conductive support having a peripheral flange having an upper surface and an upwardly extending, threaded base mounting portion having an upper surface, the support comprising a metal selected from the group consisting of copper, copper base alloys, silver, silver base alloys, aluminum and aluminum base alloys and ferrous base alloys; a ferrous base metal ring member hermetically mounted on the upper surface of the peripheral flange of the support, the ring member having a narrow circular projection extending above the upper surface of said member; a contact assembly comprising a semiconductor element and at least one cathode and anode contact disposed on the upper surface of the base mounting portion, the coefficient of expansion of the contacts and the semiconductor element being closely similar; electrical conductors joined to the cathode contact; a plurality of ferrous base metal spring washers disposed on the cathode contact around the outer periphery of the electrical conductors; a ferrous base metal cylindrical member having an integrally connected apertured cap at the upper end thereof and a threaded segment on the inner periphery of the lower end disposed on the base mounting portion and enclosing the element, the threaded segment cooperating with the threads on the base mounting portions to provide a constant pressure on the spring washers thereby exerting pressure on the contact assembly to provide good electrical contact between the cathode contact and the semiconductor element and between the anode contact and the upper surface of the base mounting portion; a header member containing an insulating segment with an electrical conductor passing therethrough and having a laterally extending ferrous base metal flange adapted to fit against the circular projection of the ring member, the flange being welded to the projection to provide a hermetic enclosure for the contact assembly; and, a stud extending from the opposite surface of the support for mounting the support on a heat sink.

No references cited.